US012444591B2

(12) United States Patent
Umeda et al.

(10) Patent No.: US 12,444,591 B2
(45) Date of Patent: Oct. 14, 2025

(54) DIAGNOSIS DEVICE, DIAGNOSIS METHOD, PLASMA PROCESSING APPARATUS, AND SEMICONDUCTOR DEVICE MANUFACTURING SYSTEM

(71) Applicant: Hitachi High-Tech Corporation, Tokyo (JP)

(72) Inventors: Shota Umeda, Tokyo (JP); Kenji Tamaki, Tokyo (JP); Masahiro Sumiya, Tokyo (JP); Yoshito Kamaji, Tokyo (JP)

(73) Assignee: Hitachi High-Tech Corporation, Tokyo (JP)

( * ) Notice: Subject to any disclaimer, the term of this patent is extended or adjusted under 35 U.S.C. 154(b) by 0 days.

(21) Appl. No.: 17/908,306

(22) PCT Filed: Jul. 13, 2021

(86) PCT No.: PCT/JP2021/026208

§ 371 (c)(1),
(2) Date: Aug. 31, 2022

(87) PCT Pub. No.: WO2023/286142

PCT Pub. Date: Jan. 19, 2023

(65) Prior Publication Data

US 2024/0213003 A1 Jun. 27, 2024

(51) Int. Cl.
*H01J 37/32* (2006.01)

(52) U.S. Cl.
CPC .. *H01J 37/32963* (2013.01); *H01J 37/32935* (2013.01)

(58) Field of Classification Search
CPC ............. G01M 99/005; H01J 37/32935; H01J 37/32963; H01J 37/32; H01J 37/3288; H01L 21/3065

(Continued)

(56) References Cited

U.S. PATENT DOCUMENTS 5,347,460 A 9/1994 Gifford et al.
6,658,423 B1 12/2003 Pugh et al.
(Continued)

FOREIGN PATENT DOCUMENTS

JP 2002-070581 A 9/2002
JP 2003-047275 A 12/2003
(Continued)

OTHER PUBLICATIONS

Search Report mailed Oct. 12, 2021 in International Application No. PCT/JP2021/026208.
(Continued)

*Primary Examiner* — Chun Cao
(74) *Attorney, Agent, or Firm* — Miles & Stockbridge, P.C.

(57) ABSTRACT

A diagnosis device that uses information from state sensors provided in a plasma processing apparatus for plasma processing a specimen to diagnose deterioration states of components configuring the plasma processing apparatus includes an execution unit that computes and calculates deterioration degree of each of the components configuring the plasma processing apparatus on the basis of the information from the state sensors, and an analysis unit that sets a computation condition for computing and calculating the deterioration degree by the execution unit on the basis of the information from the state sensors and calculates a maintenance period of the plasma processing apparatus on the basis of the information of the deterioration degree of each of the components configuring the plasma processing apparatus computed and calculated by the execution unit, and makes it possible to decide deterioration degree computation condition having high robustness for each of the components.

12 Claims, 10 Drawing Sheets

(58) Field of Classification Search
USPC .......................................................... 700/121
See application file for complete search history.

(56) References Cited

U.S. PATENT DOCUMENTS

| | | | | |
|---|---|---|---|---|
| 2003/0178140 | A1 | 9/2003 | Hanazaki et al. | |
| 2004/0147131 | A1* | 7/2004 | Kitsunai | H01J 37/32935 438/710 |
| 2004/0235304 | A1 | 11/2004 | Oh | |
| 2004/0259276 | A1 | 12/2004 | Yue et al. | |
| 2005/0004683 | A1 | 1/2005 | Yamazaki | |
| 2005/0006344 | A1 | 1/2005 | Tanaka | |
| 2005/0010318 | A1 | 1/2005 | Lev-Ami et al. | |
| 2005/0146709 | A1 | 7/2005 | Oh et al. | |
| 2005/0154482 | A1 | 7/2005 | Tomoyasu | |
| 2006/0151429 | A1* | 7/2006 | Kitsunai | H01J 37/32935 216/67 |
| 2006/0153451 | A1 | 7/2006 | Hong et al. | |
| 2006/0171848 | A1* | 8/2006 | Roche | G01R 31/2642 422/98 |
| 2007/0162172 | A1 | 7/2007 | Tanaka et al. | |
| 2008/0125898 | A1 | 5/2008 | Harvey et al. | |
| 2010/0161278 | A1 | 6/2010 | Miyano et al. | |
| 2010/0330710 | A1* | 12/2010 | Wang | H01J 37/32963 702/179 |
| 2010/0332012 | A1 | 12/2010 | Huang et al. | |
| 2010/0332201 | A1* | 12/2010 | Albarede | H01J 37/32935 703/2 |
| 2013/0045547 | A1 | 2/2013 | Izawa et al. | |
| 2015/0064923 | A1 | 3/2015 | Matsumoto et al. | |
| 2017/0256463 | A1 | 9/2017 | Bailey, III et al. | |
| 2018/0158652 | A1* | 6/2018 | Shinagawa | H01J 37/32183 |
| 2019/0088455 | A1 | 3/2019 | Kamaji et al. | |
| 2019/0252163 | A1 | 8/2019 | Gottscho | |
| 2020/0064820 | A1 | 2/2020 | Ishiguro et al. | |
| 2020/0176233 | A1* | 6/2020 | Hsieh | H01J 37/32862 |
| 2020/0243359 | A1 | 7/2020 | Hao et al. | |
| 2020/0333777 | A1 | 10/2020 | Maruyama | |
| 2021/0305027 | A1* | 9/2021 | Takayoshi | H01J 37/32917 |
| 2022/0157580 | A1 | 5/2022 | Umeda et al. | |
| 2022/0336197 | A1* | 10/2022 | Shirouzu | H01J 37/32935 |

FOREIGN PATENT DOCUMENTS

| | | | |
|---|---|---|---|
| JP | 2007-502026 | A | 2/2007 |
| JP | 2007-531922 | A | 11/2007 |
| JP | 2010-501091 | A | 1/2010 |
| JP | 2010-165949 | A | 7/2010 |
| JP | 2012-532461 | A | 12/2012 |
| JP | 2013-041954 | A | 2/2013 |
| JP | 2014-022695 | A | 2/2014 |
| JP | 2018-026558 | A | 2/2018 |
| JP | 2018-083958 | A | 5/2018 |
| JP | 2020-031096 | A | 2/2020 |
| KR | 10-1117928 | B1 | 2/2012 |
| WO | 2004105101 | A1 | 12/2004 |
| WO | 2018061842 | A1 | 4/2018 |
| WO | 2020152889 | A1 | 7/2020 |

OTHER PUBLICATIONS

Office Action mailed Apr. 20, 2021 in Japanese Application No. 2018-154589.
I.T. Jolliffe, "Discarding Variables in a Principal Component Analysis I", Journal of the Royal Statistics Society Series C, vol. 21, No. 2, pp. 160-173, 1972.
Search Report mailed Sep. 17, 2019 in International Application No. PCT/JP2019/029762.
Written Opinion mailed Sep. 17, 2019 in International Application No. PCT/JP2019/029762.
Office Action mailed Jun. 23, 2022 in U.S. Appl. No. 16/971,255.
Office Action mailed Jun. 27, 2022 in U.S. Appl. No. 16/533,273.
Office Action mailed Dec. 7, 2021 in U.S. Appl. No. 16/533,273.
Office Action mailed May 26, 2021 in U.S. Appl. No. 16/533,273.
Office Action mailed Nov. 13, 2020 in U.S. Appl. No. 16/533,273.

* cited by examiner

FIG. 2

210

| Tool ID (211) | COMPONENT ID (212) | OPERATION ID (213) | DATE AND TIME (214) | OPERATION TIME [hour] (215) |
|---|---|---|---|---|
| 100 | C1 | 5 | 2021/3/23 08:05 | 1.0 |
| ... | ... | ... | ... | ... |

FIG. 3

310

| WAFER ID (311) | PROCESSING CONDITION ID (312) | DATE AND TIME (313) | SENSOR ITEM (314) | | | |
|---|---|---|---|---|---|---|
| | | | x1 | X2 | ... | xn |
| 1 | 100 | 2021/3/17 01:01:45 | 102 | 1.02 | ... | 35 |
| | | ⋮ | ⋮ | ⋮ | ⋮ | ⋮ |
| | | ⋮ | ⋮ | ⋮ | ⋮ | ⋮ |
| ⋮ | ⋮ | ⋮ | ⋮ | ⋮ | ⋮ | ⋮ |

FIG. 7
510
COMPONENT ID: C1
500
| SECTION ID (501) | PROCESSING CONDITION ID (502) | EXTRACTION CONDITION EQUATION (503) | EXTRACTION SECTION [sec] (504) | TRIGGER 1 (t1) (505) | TRIGGER 2 (t2) (506) | ... |
|---|---|---|---|---|---|---|
| 1 | 100 | t1 and t2 | 0.0 - 5.0 | x5>9.9 | x0>0.0 | ... |
| 2 | 100 | t1 | 0.0 - 5.0 | x0>0.0 | ... | ... |
| ... | ... | ... | ... | ... | ... | ... |
FIG. 8A
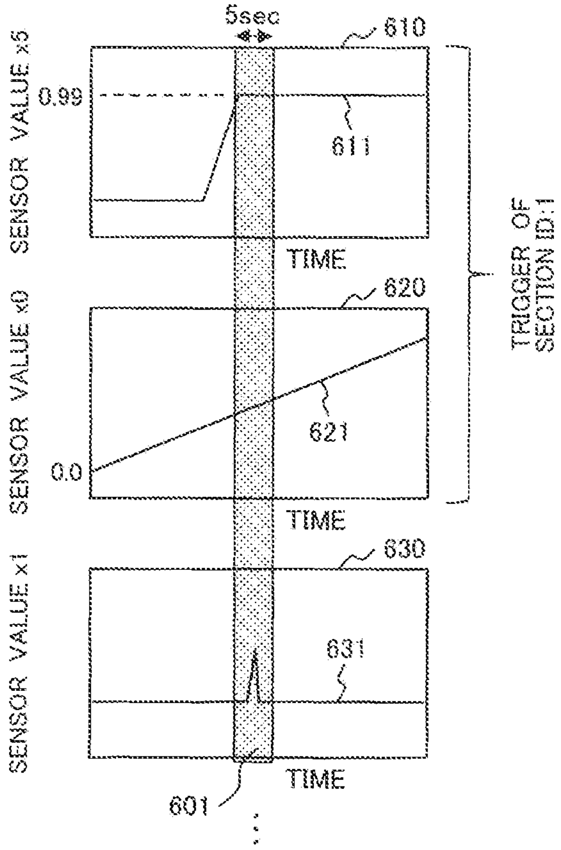
FIG. 8B
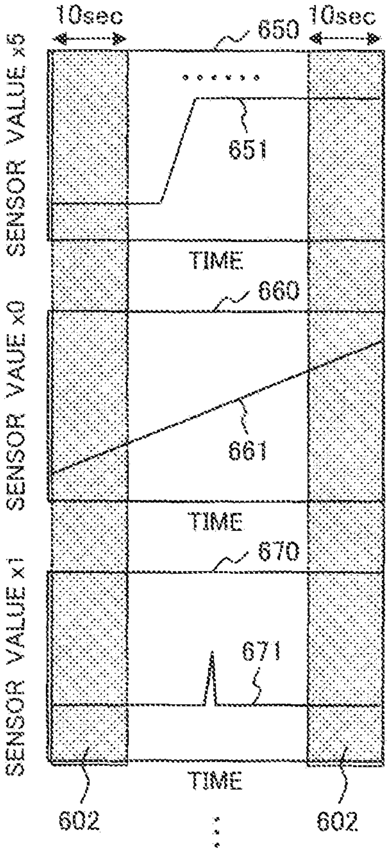

DIAGNOSIS DEVICE, DIAGNOSIS METHOD, PLASMA PROCESSING APPARATUS, AND SEMICONDUCTOR DEVICE MANUFACTURING SYSTEM

TECHNICAL FIELD

The present invention relates to a diagnosis device and a diagnosis method of a plasma processing apparatus that processes a semiconductor wafer by plasma, the plasma processing apparatus, and a semiconductor device manufacturing system.

BACKGROUND ART

A plasma processing apparatus is an apparatus, which, in order to form a minute shape on a semiconductor wafer, performs a plasma process by which a substance is converted into plasma and by the action of the substance, a substance on the wafer is removed. Typically, the plasma processing apparatus periodically performs maintenance, such as cleaning in the apparatus and component replacement, by taking, as a guide, the number of wafers processed and the like. However, due to component deterioration with change with time, reaction by-product accumulation according to a using method, and the like, an unplanned maintenance operation can occur. To reduce non-operation time due to the unplanned maintenance, it is necessary to sequentially monitor the deterioration state of a component to take early measures, such as cleaning and replacement, according to the deterioration state.

To achieve such early measures, typically, a diagnosis device of the plasma processing apparatus uses sensor values that are time series signals including a plurality of sensor items sequentially acquired from a plurality of state sensors added to the plasma processing apparatus, thereby diagnosing a deterioration state on the basis of a difference degree from the normal state, and compares the deterioration state and a previously set threshold value to issue an alarm. For example, International Publication WO 2018/061842 (Patent Literature 1) describes that "An abnormality detection device estimates a noise-removed state from a summary value by applying statistical modeling to the summary value obtained by summarizing an observation value, and generates a prediction value obtained by predicting a summary value of one preceding period on the basis of the estimation. The abnormality detection device detects whether there is an abnormality in a device to be monitored on the basis of the prediction value.".

In addition, as a method for computing a feature amount (hereinafter, a deterioration degree) effective for estimating a deterioration state from sensor values including a plurality of sensor items, for example, Japanese Patent Application Laid-Open No. 2020-31096 (Patent Literature 2) describes that "A state prediction device that predicts the state of a plasma processing apparatus calculates first feature amounts indicating the state of the plasma processing apparatus from the monitored data of the plasma processing apparatus in the normal state, calculates second feature amounts indicating the state of the plasma processing apparatus from the monitored data of the plasma processing apparatus, computes the calculated second feature amounts by using the first feature amounts, and the feature amounts selected in order from the largest computed second feature amount.".

CITATION LIST

Patent Literature

PTL 1: International Publication WO 2018/061842

PTL 2: Japanese Patent Application Laid-Open No. 2020-31096

SUMMARY OF INVENTION

Technical Problem

Patent Literature 1 describes the method for detecting an abnormality during the operation of the device by using the summary value of the sensor value, but does not describe a method for diagnosing a deterioration state for each component. For the aim to take early measures by diagnosing the deterioration states of components, since a deterioration sign, that is, a sensor value changing way, is different for each component, it is necessary to define a deterioration degree computation condition indicating the deterioration sign better for each component from the sensor values of a plurality of sensor items.

In addition, Patent Literature 2 does not assume that the defined deterioration degree computation condition is applied to a plurality of plasma processing apparatuses. For the above aim, it is necessary to have a characteristic (hereinafter, robustness) in which the deterioration degree computation condition defined for each component is applicable to the plurality of plasma processing apparatuses.

Accordingly, an object of the present invention is to provide a diagnosis device, a diagnosis method, a plasma processing apparatus, and a semiconductor device manufacturing system, which solve the above problems of the conventional art and make it possible to decide a deterioration degree computation condition having high robustness for each component.

Solution to Problem

To solve the above problems, the present invention provides a diagnosis device that diagnoses deterioration states of components of a plasma processing apparatus, the diagnosis device including an analysis unit that calculates a robustness degree with respect to each of the components under a plurality of computation conditions for computing deterioration degrees of the components, selects one computation condition from the plurality of computation conditions with respect to each of the components on the basis of the calculated robustness degree, and diagnoses the deterioration state of each of the components by using the selected computation condition.

In addition, to solve the above problems, the present invention provides a plasma processing apparatus including a processing chamber in which a specimen is plasma processed, a radio frequency power supply that supplies radio frequency power for generating plasma, and a specimen stage on which the specimen is placed, the plasma processing apparatus further including a diagnosis device that calculates a robustness degree with respect to each of the components under a plurality of computation conditions for computing deterioration degrees of the components, selects one computation condition from the plurality of computation conditions with respect to each of the components on the basis of the calculated robustness degree, and diagnoses the deterioration state of each of the components by using the selected computation condition.

Further, to solve the above problems, the present invention provides a plasma processing apparatus including a processing chamber in which a specimen is plasma processed, a radio frequency power supply that supplies radio frequency power for generating plasma, and a specimen stage on which the specimen is placed, in which the plasma processing apparatus is connected to a diagnosis device that calculates a robustness degree with respect to each of the components under a plurality of computation conditions for computing deterioration degrees of the components, selects one computation condition from the plurality of computation conditions with respect to each of the components on the basis of the calculated robustness degree, and diagnoses the deterioration state of each of the components by using the selected computation condition.

Further, to solve the above problems, the present invention provides a diagnosis method for diagnosing deterioration states of components of a plasma processing apparatus, the diagnosis method having the steps of calculating a robustness degree with respect to each of the components under a plurality of computation conditions for computing deterioration degrees of the components, selecting one computation condition from the plurality of computation conditions with respect to each of the components on the basis of the calculated robustness degree, and diagnosing the deterioration state of each of the components by using the selected computation condition.

Further, to solve the above problems, the present invention provides a semiconductor device manufacturing system that is connected to a semiconductor manufacturing apparatus via a network and includes a platform executing a diagnosis process for diagnosing deterioration states of components of the semiconductor manufacturing apparatus, in which the diagnosis process has the steps of calculating a robustness degree with respect to each of the components under a plurality of computation conditions for computing the deterioration degrees of the components, selecting one computation condition from the plurality of computation conditions with respect to each of the components on the basis of the calculated robustness degree, and diagnosing the deterioration state of each of the components by using the selected computation condition.

Advantageous Effects of Invention

According to the present invention, for example, the user of the plasma processing apparatus and its diagnosis device can acquire the deterioration degree computation condition having high robustness for each of the components, and can diagnose the component deterioration states of the plasma processing apparatuses.

Objects, configurations, and effects other than the above will be apparent from the description of the following embodiment.

BRIEF DESCRIPTION OF DRAWINGS

FIG. 2 is a diagram illustrating, in a table form, an example of data stored in a maintenance history storage unit according to the example of the present invention.

FIG. 3 is a diagram illustrating, in a table form, an example of data stored in a sensor value storage unit of the diagnosis device according to the example of the present invention.

FIG. 7 is a diagram illustrating, in a table form, data stored in a section extraction condition storage unit of the diagnosis device according to the example of the present invention.

FIG. 8A is a diagram illustrating, in a graph illustrating the relationship between the sensor value of each sensor and time, an example of a process for extracting the time section of the sensor value by trigger setting, and FIG. 8B is a diagram illustrating, in a graph illustrating the relationship between the sensor value of each sensor and time, an example of a process for extracting the time section of the sensor value by window movement.

DESCRIPTION OF EMBODIMENTS

Figure 1:
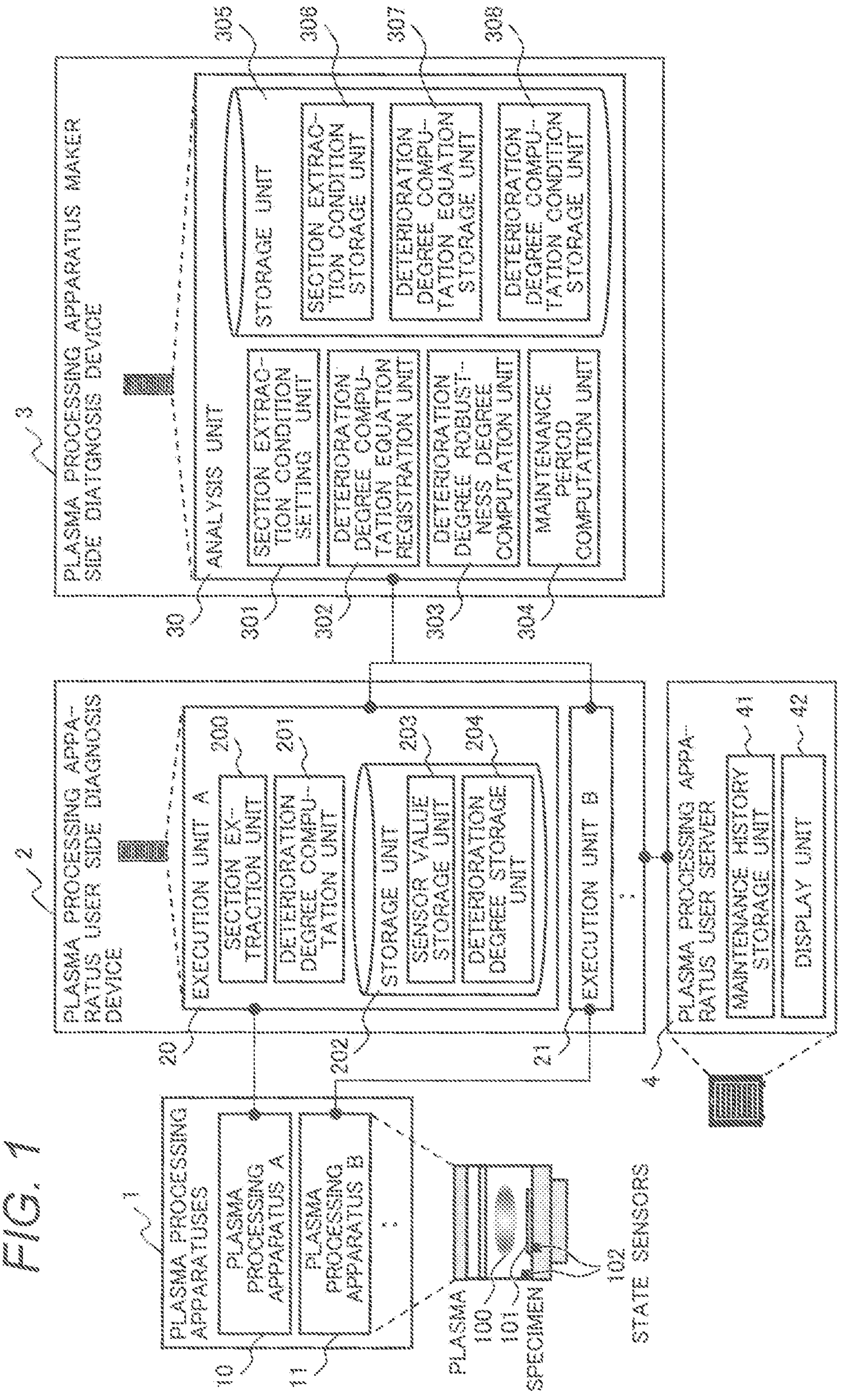
FIG. 1 is a block diagram illustrating the schematic configuration of a plasma processing apparatus and a diagnosis device according to an example of the present invention.

The present invention provides a diagnosis device and a diagnosis method of a plasma processing apparatus, which acquire the time series sensor value of a target component of the plasma processing apparatus and diagnose a deterioration state, the diagnosis device and the diagnosis method deciding, from among a plurality of deterioration degree computation conditions including combinations of a plurality of time sections and a plurality of deterioration degree computation equations, the deterioration degree computation condition applied to the target component on the basis of a deterioration degree robustness degree calculated by comparison computation between a plurality of maintenance cases of the deterioration degrees, and issuing a maintenance alarm on the basis of the deterioration degree of the target component sequentially computed under the deterioration degree computation condition in the plasma processing apparatuses.

In addition, the present invention provides a plasma processing apparatus that includes a diagnosis device that decides, from among a plurality of deterioration degree computation conditions including combinations of a plurality of time sections and a plurality of deterioration degree computation equations, the deterioration degree computation condition applied to a target component on the basis of a deterioration degree robustness degree calculated by comparison computation between a plurality of maintenance cases of the deterioration degrees, and issues a maintenance alarm on the basis of the deterioration degree of the target component sequentially computed under the deterioration degree computation condition in the plasma processing apparatuses.

The present invention provides a diagnosis device of a plasma processing apparatus that includes a deterioration degree robustness degree computation unit that acquires deterioration degrees equal in number to that of a plurality of maintenance cases, computed under a plurality of deterioration degree computation conditions of a target component, computes a deterioration degree robustness degree previously defined for each of the computation conditions, and outputs the computation condition ranked on the basis of the deterioration degree robustness degree, a unit for setting a section extraction condition for each component that sets a plurality of time section (step time section) extraction conditions with respect to the target component by the unit for setting the section extraction condition for each component, and a deterioration degree computation equation registration unit that registers a plurality of deterioration degree computation equations for capturing various deterioration signs.

Further, the present invention provides a diagnosis device that acquires the sensor values of a plurality of items from state sensors for pressure, electric current, and the like of a plasma processing apparatus and diagnoses the deterioration state of a component to be maintained configuring the plasma processing apparatus, the diagnosis device previously deciding, from among deterioration degree computation conditions including combinations of a plurality of time sections and a plurality of deterioration degree computation equations, the deterioration degree computation condition applied to the target component on the basis of a deterioration degree robustness degree calculated by performing comparison computation of deterioration degrees between a plurality of maintenance cases of the target component in the plasma processing apparatus, and issuing a maintenance alarm on the basis of the deterioration degree of the target component sequentially computed by applying the deterioration degree computation condition to the plasma processing apparatuses to be diagnosed, or presenting a maintenance recommendation period, so that the deterioration degree computation condition having high robustness and applicable to the plurality of plasma processing apparatuses can be decided for each of the components.

Hereinafter, an embodiment of the present invention will be described with reference to the drawings. Note that in all the drawings for describing the embodiment, the same parts are indicated by the same reference numerals as a rule, and the repeated description thereof is omitted.

Example (1) Plasma Processing Apparatus

As illustrated in the block diagram in FIG. 1, plasma processing apparatuses 1 of this example generate plasma 100 to process a wafer (a specimen 101) according to a previously set processing condition. In addition, the plasma processing apparatuses 1 have state sensors 102, and can acquire, as time series data, the measurement values of sensor values (for example, temperature and pressure) during wafer processing or idling.

(2) Diagnosis Device

As illustrated in the block diagram in FIG. 1, a diagnosis device includes a plasma processing apparatus user side diagnosis device 2 (hereinafter, simply referred to as a diagnosis device 2) including an execution unit 20 that executes a process with respect to each plasma processing apparatus of the plasma processing apparatuses 1, and a plasma processing apparatus maker side diagnosis device 3 (hereinafter, simply referred to as a diagnosis device 3) including an analysis unit 30 that performs analysis with respect to the plasma processing apparatuses 1. The diagnosis device 2 is connected to the plasma processing apparatuses 1 directly or via a network, and the diagnosis device 3 is connected to the diagnosis device 2 via the network.

In addition, for example, the diagnosis device 2 is connected to a plasma processing apparatus user server 4 directly or via the network, can transmit an output result to display it on a display unit 42, and can receive the information of a maintenance history storage unit 41.

FIG. 2 is an example of data 210 stored in the maintenance history storage unit 41. For example, a Tool ID 211, a component ID 212, and an operation ID 213, which identify an apparatus to be maintained, a component to be maintained, and an operation (replacement, cleaning, and the like), respectively, are stored. In addition, a date and time 214 and operation time 215 in which the maintenance operation is executed are stored together.

A form is taken in which for example, the diagnosis device 2 is held by the user of the plasma processing apparatuses 1 and for example, the diagnosis device 3 is held by a plasma processing apparatus maker. By taking such form, the diagnosis device 2 can be installed adjacent to the plasma processing apparatuses 1, so that the acquiring of the sensor values acquired from the state sensors 102 and deterioration degree computation can be executed with low delay. In addition, the apparatus maker sets a deterioration degree computation condition, and the apparatus user can acquire the deterioration degree diagnosis result of a component to be diagnosed without setting the deterioration degree computation condition. In addition, this example can be embodied also by transmitting a deterioration degree computation result without transmitting all the sensor values from the diagnosis device 2 to the diagnosis device 3, and the apparatus user can inhibit the sensor values from to be disclosed to the apparatus maker side.

The execution unit 20 of the diagnosis device 2 has a storage unit 202 that includes a sensor value storage unit 203 and a deterioration degree storage unit 204, and further, has a section extraction unit 200 and a deterioration degree computation unit 201.

The analysis unit 30 of the diagnosis device 3 has a storage unit 305 that includes a section extraction condition storage unit 306, a deterioration degree computation equation storage unit 307, and a deterioration degree computation condition storage unit 308, and further, has a section extraction condition setting unit 301, a deterioration degree computation equation registration unit 302, a deterioration degree robustness degree computation unit 303, and a maintenance period computation unit 304.

The sensor value storage unit 203 of the storage unit 202 of the diagnosis device 2 stores the sensor values acquired from the state sensors 102. FIG. 3 is a diagram illustrating an example of a processing data 310 stored in the sensor value storage unit 203. The measurement value of the sensor value is stored as the time series data for each sensor item 314 together with a date and time 313 in which it is acquired. In addition, together with the sensor value, for example, identification information that identifies a process and a processing target, such as a wafer ID 311 and a processing condition ID 312, is stored. The wafer ID 311 is information for identifying the processed wafer (specimen 101). The processing condition ID 312 is information for identifying the setting and the process steps of the plasma processing apparatus in performing the process.

Figure 4:
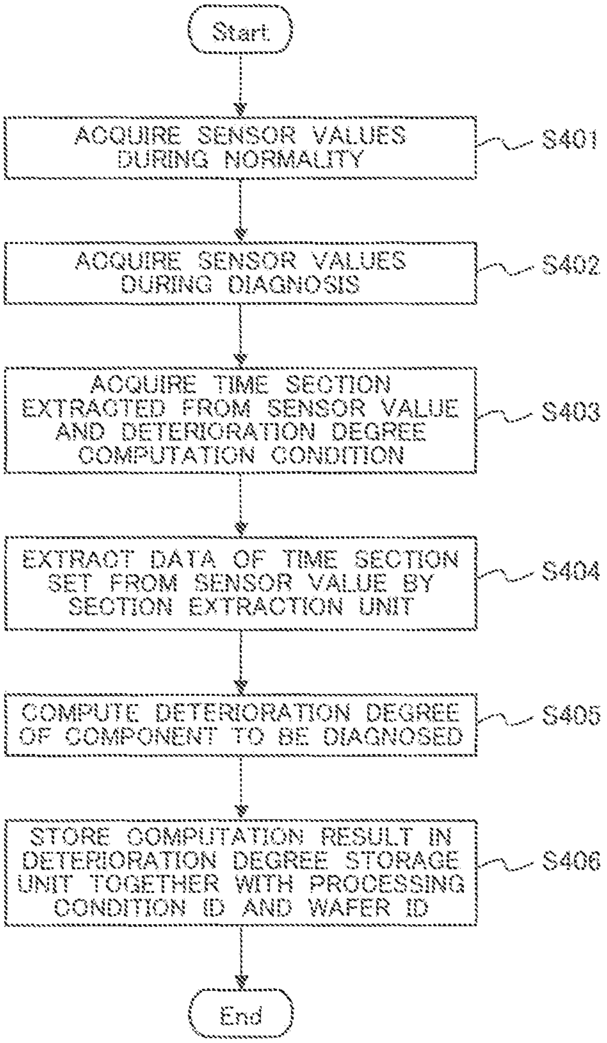
FIG. 4 is a flow diagram illustrating the flow of a process for calculating the deterioration degree of a component to be diagnosed in a deterioration degree computation unit according to the example of the present invention.

FIG. 4 illustrates the flow of a process for calculating the deterioration degree of the component to be diagnosed in the deterioration degree computation unit 201. First, the deterioration degree computation unit 201 acquires, from the sensor value storage unit 203, the sensor values of the state sensors 102 at the time of processing the wafers (specimens 101) when the component to be diagnosed is normal (for example, in a fixed period after immediately maintenance) (S401), and acquires the sensor values of the state sensors 102 when the wafers (specimens 101) are processed during diagnosis (S402). In addition, the deterioration degree computation unit 201 acquires a time section extracted from the sensor value in the processing condition set to each component to be diagnosed and the deterioration degree computation condition including a deterioration degree computation equation, which are stored in the deterioration degree computation condition storage unit 308 (S403).

Further, the section extraction unit 200 extracts the data of the time section set from the sensor value according to the deterioration degree computation condition (S404), and the deterioration degree computation unit 201 computes the deterioration degree of the component to be diagnosed by using the deterioration degree computation equation of the deterioration degree computation condition acquired in S403 (S405), and stores the computation result in the deterioration degree storage unit 204 (S406). In this case, the processing condition ID 312 that identifies the used deterioration degree computation condition and the wafer ID 311 during diagnosis having one-to-one correspondence with the deterioration degree are also stored in the deterioration degree storage unit 204.

Figure 5:
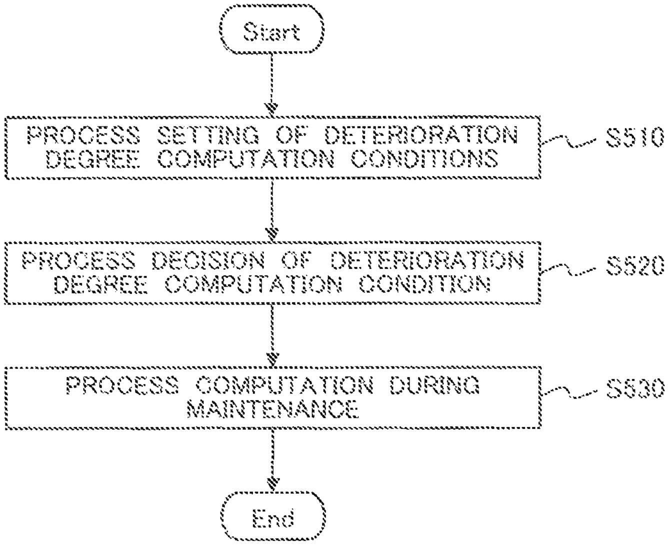
FIG. 5 is a flow diagram illustrating the flow of the process of an analysis unit according to the example of the present invention.

Next, the flow diagram in FIG. 5 illustrates the flow of a process performed by each portion of the analysis unit 30. First, the analysis unit 30 sets deterioration degree computation conditions (S510), decides the deterioration degree computation condition from among the set deterioration degree computation conditions (S520), and performs a computation process for calculating the deterioration degree of the apparatus component during maintenance by using the decided deterioration degree computation condition (S530).

The detail of each step will be described below. The processing contents of will be described later in detail.

(3) A Deterioration Degree Computation Conditions Setting Process: S510

An example of a deterioration degree computation conditions setting process performed by the analysis unit 30 of the diagnosis device 3 will be described with reference to FIG. 6.

First, the section extraction condition setting unit 301 sets a plurality of time section extraction conditions of the sensor values of the component to be diagnosed under a particular processing condition, and stores them in the section extraction condition storage unit 306 (S511). In order that the deterioration degrees can be compared between the plasma processing apparatuses 1, as the processing condition, for example, it is desirable to designate the processing condition that is performed in a shareable manner by the plasma processing apparatuses 1 for an aging process that adjusts the plasma state of the plasma processing apparatus, an apparatus diagnosing process, and the like.

FIG. 7 illustrates an example of a time section extraction condition 500 stored in the section extraction condition storage unit 306 when a component ID 510 is C1. A section ID 501 is information that identifies the time section extraction condition. The designated processing condition ID is stored in a processing condition ID 502. For example, the time section extraction condition 500 when the section ID 501 in the drawing is 1 is the time section extraction condition in which the case where the sensor value in which the sensor item 314 in the processing data 310 illustrated in FIG. 3 is ×5 exceeds 9.9 is a trigger 1 (t1): 505, the case where the sensor in which the sensor item 314 is ×0 exceeds 0.0 is a trigger 2 (t2): 506, and the time section from 0.0 to 5.0 sec, starting from the point in time when the conditions of t1 and t2 that are extraction condition equations 503 are satisfied is an extraction section 504. The time section extraction condition 500 may set each trigger like the trigger 1 (t1): 505 and the trigger 2 (t2): 506, or may automatically set a plurality of time section extraction conditions while the window is moved little by little in the time section from 0.0 to 10.0 sec, from 1.0 to 11.0 sec, . . . by a designated window width (for example, 10 sec).

FIGS. 8A and 8B each illustrate an example of a process by which the section extraction unit 200 extracts the time section of each sensor value according to the time section extraction condition of the section extraction condition storage unit 306.

FIG. 8A is an example in which the time section of each sensor value is extracted under the section extraction condition in which the section ID 501 of the time section extraction condition 500 illustrated in FIG. 7 is 1, a graph 610 is a graph illustrating the time change in an output 611 of the sensor ×5, a graph 620 is a graph illustrating the time change in an output 621 of the sensor ×0, and a graph 630 is a graph illustrating the time change in an output 631 of the sensor ×1. A time section 601 is extracted according to the values of the sensor value ×5 and the sensor ×0, respectively, set as the trigger 1: 505, the trigger 2: 506.

FIG. 8B is an example in which a time section 602 of each sensor value is extracted under the time section extraction condition automatically set by the window movement, a graph 650 is a graph illustrating the time change in an output 651 of the sensor ×5 like the graph 610, a graph 660 is a graph illustrating the time change in an output 661 of the sensor ×0 like the graph 620, and a graph 670 is a graph illustrating the time change in an output 671 of the sensor ×1 like the graph 630.

Figure 6:
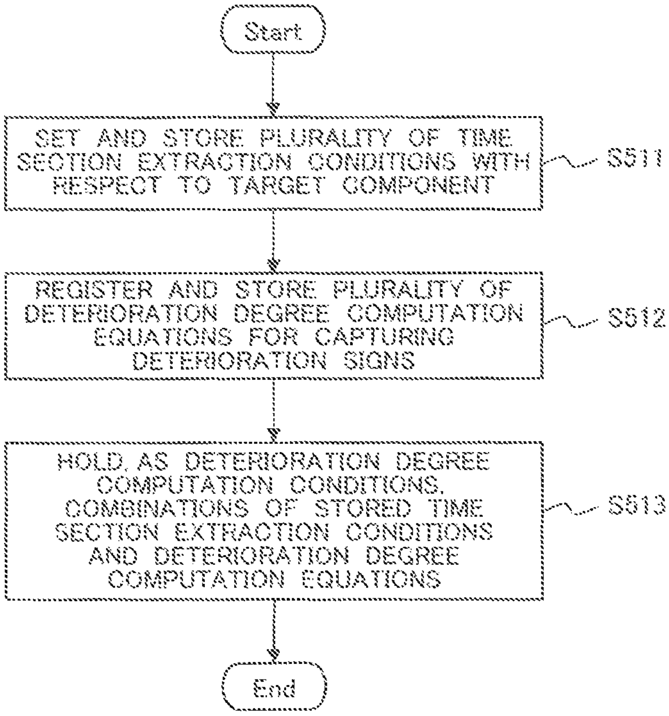
FIG. 6 is a flow diagram illustrating the flow of a deterioration degree computation conditions setting process of the diagnosis device according to the example of the present invention.

Next, returning to the flow diagram in FIG. 6, a plurality of deterioration degree computation equations for capturing the deterioration signs are registered in the deterioration degree computation equation registration unit 302, and are stored in the deterioration degree computation equation storage unit 307 (S512). Equation IDs that are information identifying the registered deterioration degree computation equations are also stored in the deterioration degree computation equation storage unit 307. The deterioration degree computation equation is a computation equation and a computation program in which the sensor values after the time section extraction during normality and diagnosis are received as inputs, and the difference degree of the sensor value during diagnosis from the sensor value during normality is outputted as the deterioration degree. As the deterioration degree computation equation, for example, a k-nearest neighbor method and a singular spectrum transformation method that are machine learning methods, or a method by which a state space model is utilized, which is a statistical modeling method can be used.

Lastly, combinations of the plurality of time section extraction conditions (section IDs 501) set to the target component in S511 and the plurality of deterioration degree computation equations (equation IDs) stored in the deterioration degree computation equation storage unit 307 are stored, as the deterioration degree computation conditions, in the deterioration degree computation condition storage unit 308. For the respective deterioration degree computation conditions, the deterioration degree computation condition IDs that uniquely identify them are also stored (S513).

Figures 9A, 9B:
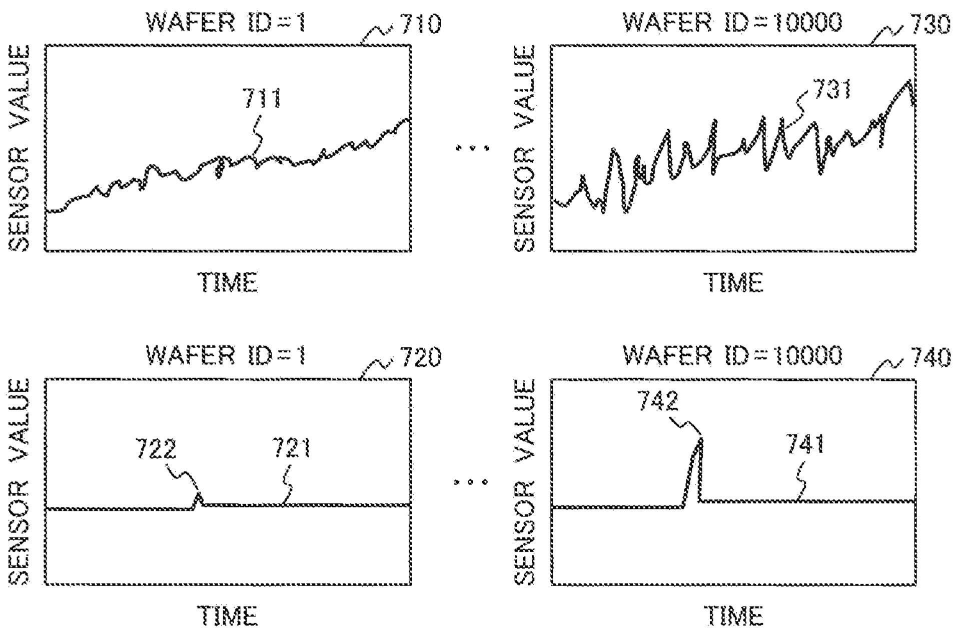
FIG. 9A is a graph illustrating the relationship between the sensor value of each sensor and time during normality.
FIG. 9B is a graph illustrating the relationship between the sensor value of each sensor and time during deterioration.

FIGS. 9A and 9B are diagrams illustrating examples of the deterioration signs. That is, the deterioration signs are the change in sensor waveform during normality illustrated in FIG. 9A and during deterioration illustrated in FIG. 9B. Each of graphs 710, 730, and 720, 740 is an example of the time series waveform of the sensor value in the same processing condition of the same sensor item, a waveform 711 of the graph 710 and a waveform 721 of the graph 720 are each an example of the waveform during normality, and a waveform 731 of the graph 730 and a waveform 741 of the graph 740 are each an example of the waveform during deterioration.

Like the waveform 711 of the graph 710 and the waveform 731 of the graph 730, the sensor item that exhibits the deterioration sign over the entire time section in the processing time is present, and like a peak waveform 722 of the waveform 721 of the graph 720 and a peak waveform 742 of the waveform 741 of the graph 740, the sensor item that exhibits the deterioration sign in only part of the time section in the processing time is also present. Therefore, unless the time section extraction is appropriately performed, the sensitivity of the deterioration diagnosis can be lowered.

In S512 of the flow diagram in FIG. 6, for example, for the component used for the plasma generation, the time section for several seconds is extracted, starting from the time at which the plasma is generated, and in such a manner, the time section suitable for capturing the deterioration sign can be set for each component. In this way, a plurality of time section extraction conditions are set for each component by the time section extraction in which the possibility of exhibiting the deterioration sign is high and the encompassing time section extraction by the window movement, so that the sensitivity of the deterioration diagnosis can be prevented from to be lowered.

In addition, like the examples illustrated in FIGS. 9, there can also be a plurality of types of deterioration signs, that is, sensor waveform changes. Some of the types of the waveform change detected by the deterioration degree computation method are advantageous and some are disadvantageous, so that by registering the plurality of deterioration degree computation equations in S513, the deterioration diagnosis is enabled even when there are various deterioration signs.

(4) A Deterioration Degree Computation Condition Decision Process: S520

Figure 10:
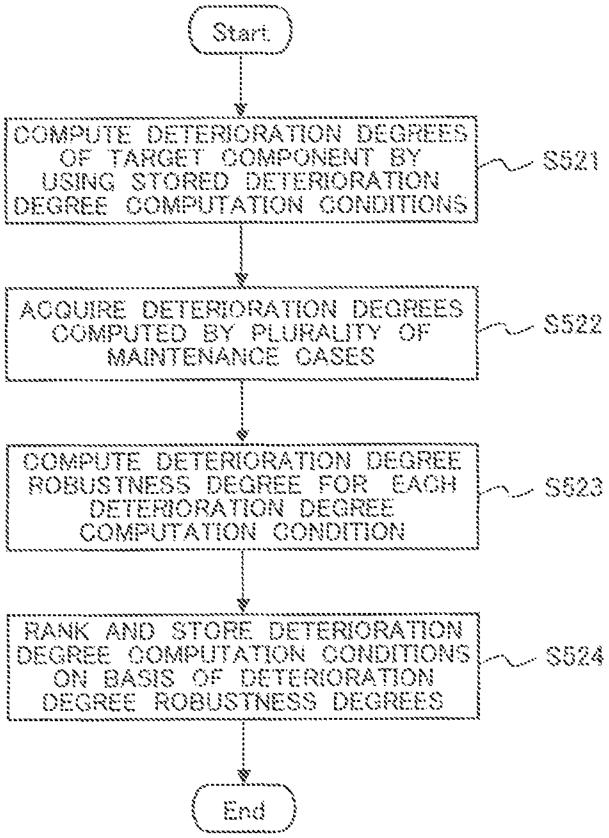
FIG. 10 is a flow diagram illustrating the flow of a deterioration degree computation condition decision process of the diagnosis device according to the example of the present invention.

An example of a deterioration degree computation condition decision process performed by the analysis unit 30 of the diagnosis device 3 will be described with reference to the flow diagram illustrated in FIG. 10.

First, acquired are the transitions of the deterioration degrees when by using the sensor values from the normal state immediately after the maintenance of the target component to maintenance, which are stored in the sensor value storage unit 203 (hereinafter, a maintenance case) and the deterioration degree computation conditions stored in the deterioration degree computation condition storage unit 308, the deterioration degrees are computed by the deterioration degree computation unit 201, and are stored in the deterioration degree storage unit 204, and each of the deterioration degree computation conditions is applied in the maintenance case (S521).

Next, S521 is performed with respect to a plurality of maintenance cases of the target component, thereby acquiring (the transitions of) the deterioration degrees computed with respect to the sensor values of the plurality of maintenance cases and stored in the deterioration degree storage unit 204 (S522). For the sensor values of the plurality of maintenance cases, a plurality of maintenance cases may be collected from a plurality of plasma processing apparatuses 10, 11, . . . , or a plurality of maintenance cases may be collected from the single plasma processing apparatus 10 or 11. In addition, to each of the maintenance cases, a case ID that can uniquely identify it is given.

Next, by using the deterioration degrees of the plurality of maintenance cases acquired in S522, a deterioration degree robustness degree is computed for each of the deterioration degree computation conditions by the deterioration degree robustness degree computation unit 303 (S523). The deterioration degree robustness degree is computed by using the deterioration degrees under the same deterioration degree computation condition of the plurality of maintenance cases, and is an index indicating the height of the shareability of the tendency over the cases of the deterioration degrees computed under the deterioration degree computation condition.

The method for computing the deterioration degree robustness degree of the deterioration degree robustness degree computation unit 303 is not uniquely limited, but, for example, the deterioration degree desirably monotonically increases in between one maintenance case due to its characteristic, and the correlation coefficient between the wafer ID (the number of processed wafers) and the deterioration degree is desirably high, so that an average value over a plurality of maintenance cases of the correlation coefficients computed with respect to the respective maintenance cases is computed as the deterioration degree robustness degree.

In addition, for example, as the height of the shareability of the values of the deterioration degrees during maintenance, the reciprocal number of the standard deviation over the plurality of maintenance cases of the deterioration degrees during maintenance may be computed as the deterioration degree robustness degree, or the above deterioration degree robustness degree computation methods may be combined.

The computed deterioration degree robustness degree is stored in the deterioration degree computation condition storage unit 308 so as to be associated with the deterioration degree computation condition ID and the case ID of the sensor value used in computation.

Lastly, the deterioration degree computation conditions are ranked in the descending order of the deterioration degree robustness degrees computed for the respective deterioration degree computation conditions by the deterioration degree computation equation registration unit 302 (S524).

Figure 11:
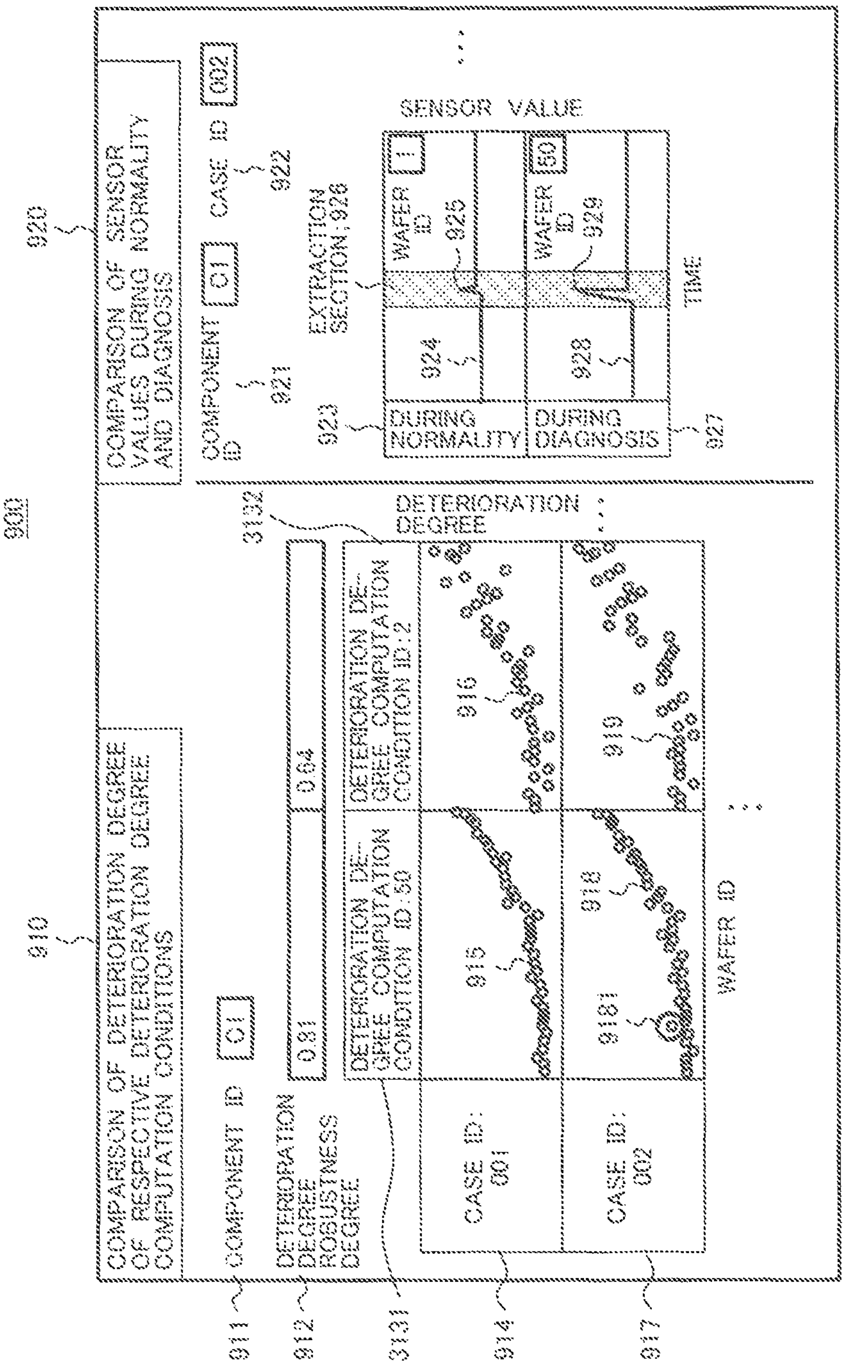
FIG. 11 is a front view of a display screen outputting the computation result of a deterioration degree robustness degree computation unit of the diagnosis device according to the example of the present invention.

FIG. 11 illustrates an example of a display screen 900 with respect to the output of the deterioration degree robustness degree computation unit 303. The display screen 900 displays a region 910 of comparison of deterioration degrees of respective deterioration degree computation conditions, and a region 920 of comparison of sensor values during normality and diagnosis.

In the region 910 of comparison of deterioration degrees of respective deterioration degree computation conditions, the transitions of the deterioration degrees obtained by acquiring the information corresponding to a component ID: 911 stored in the deterioration degree computation condition storage unit 308 and the deterioration degree storage unit 204 and by being computed with respect to sensor values (case IDs) 914, 917 of the respective maintenance cases with the use of the respective deterioration degree computation conditions (deterioration degree computation condition IDs) are displayed in graphs 915, 916, 918, 919, and values 912 of the deterioration degree robustness degrees are also displayed (D1). A deterioration degree computation condition ID: 50 3131 on the left side is a deterioration degree computation condition having a higher deterioration degree robustness degree than a deterioration degree computation condition ID: 2 3132 on the right side, and the deterioration degree computation condition having high robustness and the transition state of the deterioration degree with respect to the condition can be confirmed in the graphs 915, 916, 918, 919, and by observing these, the user can decide the deterioration degree computation condition having a high robustness degree.

In addition, each deterioration degree computed for each wafer ID is selected like 9181, so that in the region 920 of comparison of sensor values during normality and diagnosis, a sensor value 924 during normality 923 and a sensor value 928 during diagnosis 927 in an extraction section 926 corresponding to a selected component ID 921 and a case ID 922 can be compared. By observing these, for example, the user can determine the reason why the deterioration degree becomes high, from the change in peak waveforms 925 and 929 of the sensor values.

From the above process, the deterioration degree computation condition having a high deterioration degree robustness degree can be acquired as the deterioration degree computation condition having high robustness in the deterioration diagnosis of the target component, and this is stored in the deterioration degree computation condition storage unit 308.

(5) A Maintenance Period Computation Process: S530

Figure 12:
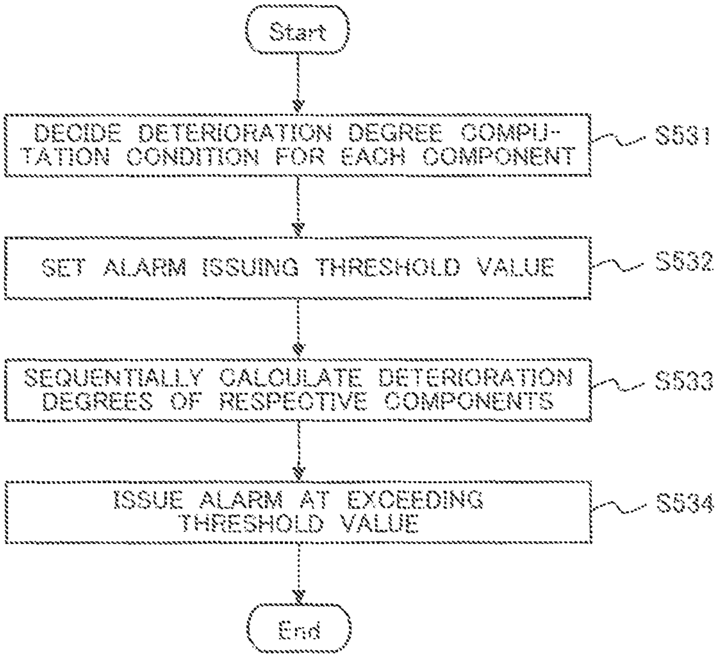
FIG. 12 is a flow diagram illustrating the flow of a maintenance period computation process of the diagnosis device according to the example of the present invention.

An example of a maintenance period computation process of the diagnosis device 3 will be described with reference to the flow diagram in FIG. 12.

First, the deterioration degree computation condition used for diagnosis is decided on the basis of the deterioration degree robustness degree for each component (S531). A deterioration degree computation condition having the largest deterioration degree robustness degree may be decided, or a deterioration degree computation condition having a higher satisfaction feeling may be decided by the comparison with the component knowledge, from among the deterioration degree computation conditions having the high deterioration degree robustness degrees after the confirmation of the sensor value 924 during normality 923 and the sensor value 928 during diagnosis 927 displayed in the region 920 of comparison of sensor values during diagnosis on the display screen 900 in FIG. 11.

Next, the threshold value of the deterioration degree that issues an alarm is previously set for each component (S532). For example, the values of the deterioration degrees during maintenance of the plurality of maintenance cases or at the point in time just before the fixed period with respect to during maintenance are collected, and the 95% percentile value thereof is used. The use of the percentile value and the value of "95" are only examples, and the present invention is not limited to these.

Next, the deterioration degree computation conditions of the respective components stored in the deterioration degree computation condition storage unit 308 are applied to the plasma processing apparatuses 1, and the sequentially acquired sensor values and deterioration degree computation conditions are used to sequentially compute the deterioration degrees of the respective components by the deterioration degree computation unit 201 (S533).

Figure 13:
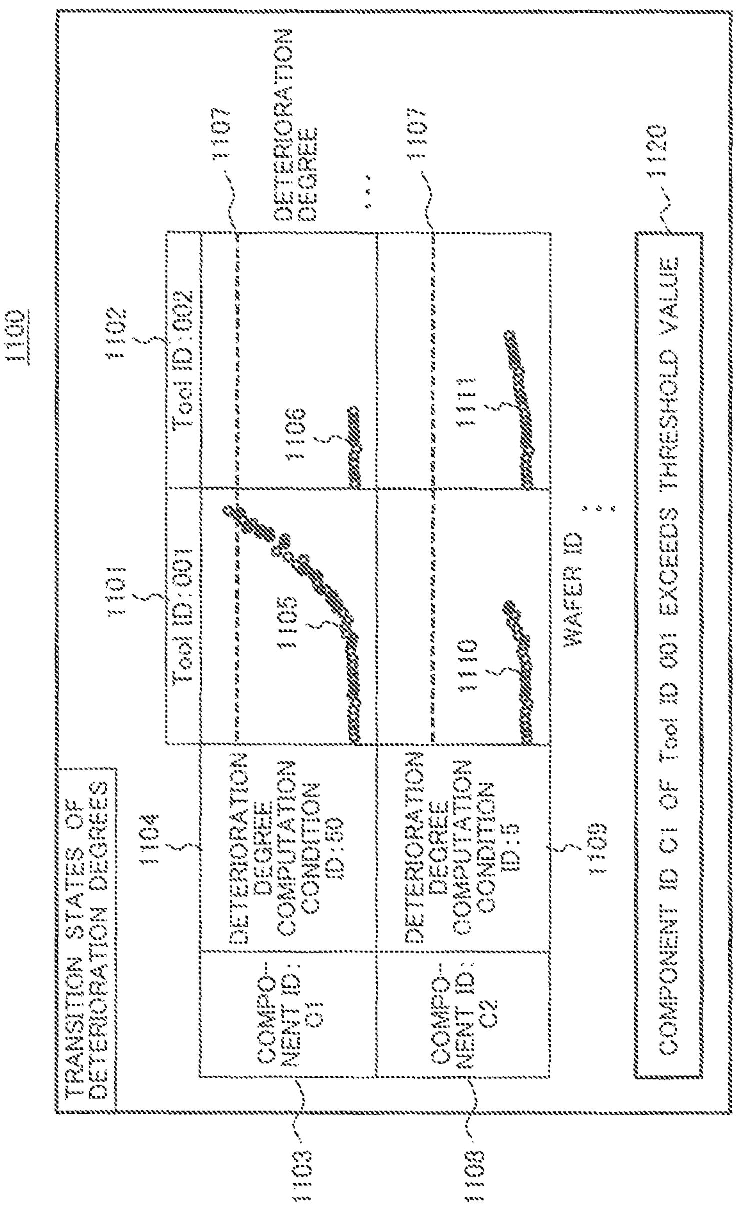
FIG. 13 is a front view of a display screen displaying the processing result of a maintenance period computation unit of the diagnosis device according to the example of the present invention.

When the value exceeds the set threshold value at the time of computing the deterioration degree, an alarm is issued like a region 1120 on a display screen 1100 illustrated in FIG. 11, and the maintenance of the component corresponding to the deterioration degree is promoted (S534). FIG. 13 illustrates an example of the display screen 1100 with respect to the outputs of the maintenance period computation process. Sequential computation results 1105, 1106, 1110, 1111 of the deterioration degrees computed according to deterioration degree computation conditions 1104, 1109 decided for the respective components (component IDs 1103, 1108) are displayed together over a plurality of plasma processing apparatuses 1101, 1102. In addition, a threshold value 1107 set in S31 is displayed for each of the set of the component ID 1103 and the deterioration degree computation condition ID 1104 and the set of the component ID 1108 and the deterioration degree computation condition ID 1109.

By observing the display screen 1100, the user can centrally manage the deterioration states of the respective components to be maintained of the plasma processing apparatuses 1, and it is possible to lead to the reduction in the non-operation time of the plasma processing apparatuses 1 due to unplanned maintenance by performing early maintenance with respect to the component to be maintained on the basis of the issued alarm.

In addition, the method for issuing the alarm to the region 1120 on the basis of the threshold value 1107 has been described, but for example, the maintenance occurrence period can also be predicted by predicting, on the basis of the transition of the deterioration degree of up to the point in time of diagnosis, the transition of the deterioration degree after the point in time of diagnosis, and may be displayed. By observing it, for example, the user can perform the advance preparation of the maintenance component, thereby enabling to lead to the lead time reduction in component replacement.

As described above, the diagnosis device that diagnoses the deterioration state of the target component of the plasma processing apparatus that performs the process for processing the specimen, which has been described in this example acquires the time series sensor values from the state sensors of the target component of the plasma processing apparatus, computes the deterioration degree by the deterioration degree computation equation using the sensor values during normality and diagnosis, acquires the plurality of cases of the sensor values between maintenances from the plasma processing apparatus, decides, from among the deterioration degree computation conditions including combinations of the plurality of time sections of the sensor values and the plurality of deterioration degree computation equations, the deterioration degree computation condition on the basis of the deterioration degree robustness degree calculated by comparison computation between the plurality of cases of the deterioration degrees, and on the basis of the deterioration degrees of the target component sequentially computed by using the deterioration degree computation conditions decided in the plasma processing apparatuses, issues the maintenance alarm or presents the maintenance recommendation period.

In addition, the diagnosis device according to this example includes the plasma processing apparatus maker side diagnosis device and the user side diagnosis device, and the plasma processing apparatus maker side diagnosis device receives the deterioration degree computed by the plasma processing apparatus user side diagnosis device associated with the plasma processing apparatuses, and transmits the decided deterioration degree computation condition to the user side diagnosis device, and the user side diagnosis device transmits the deterioration degree computed by using the deterioration degree computation condition to the server of the plasma processing apparatus user.

Further, in the diagnosis device according to this example, for the time section set to the time series sensor value, any section width is automatically acquired, starting from the determination of the sensor value threshold value set to each target component, or is automatically acquired by the window movement of the fixed section width previously set from the entire time section.

Further, in the diagnosis device according to this example, the deterioration degree robustness degree is an index indicating the height of the shareability of the tendency between the plurality of maintenance cases of the deterioration degrees, and the correlation coefficients between the numbers of processed wafers and the deterioration degrees are taken by the plasma processing apparatus, the average value of the correlation coefficients over the plurality of maintenance cases is computed as the deterioration degree robustness degree, or the statistical amount of the deterioration degree at the point in time of maintenance in the plurality of maintenance cases is computed as the deterioration degree robustness degree.

Further, in the diagnosis device according to this example, when the deterioration degree computed by using the deterioration degree computation condition is designated, the sensor value during normality and the sensor value during diagnosis are comparison displayed together with the time section set to the time series sensor value.

According to this example, the deterioration degree computation condition for calculating the deterioration degree of the component configuring the plasma processing apparatus can be selected from among the plurality of computation equations stored in the deterioration degree computation equation storage unit on the basis of the information of the robustness degree calculated by the deterioration degree robustness degree computation unit, so that the maintenance period can be calculated with a higher reliability degree.

In addition, as the embodiment of the described example, a semiconductor device manufacturing system that executes an application operating and managing a line including a semiconductor manufacturing apparatus on a platform can be considered. In this case, by executing the process in such a manner that at least the function of the plasma processing apparatus maker side diagnosis device 3 is used as the application on the platform, so that the semiconductor device manufacturing system can embody this example. Further, the application may be an application having, other than the function of the plasma processing apparatus maker side diagnosis device 3, the function of the plasma processing apparatus user side diagnosis device 2 and the function of the plasma processing apparatus user server 4.

The example has been described above, but the present invention is not limited to the example, and can be variously changed within the scope not departing from its purport.

REFERENCE SIGNS LIST

1 . . . plasma processing apparatuses,
2 . . . plasma processing apparatus user side diagnosis device,
3 . . . plasma processing apparatus maker side diagnosis device,
4 . . . plasma processing apparatus user server,
20 . . . execution unit,
30 . . . analysis unit,
200 . . . section extraction unit,
301 . . . section extraction condition setting unit,
302 . . . deterioration degree computation equation registration unit,
303 . . . deterioration degree robustness degree computation unit,
304 . . . maintenance period computation unit,
42 . . . display unit

The invention claimed is:

1. A maker-side diagnosis device that diagnoses the deterioration states of a plurality of components of a plasma processing apparatus, the maker-side diagnosis device comprising:

a network interface for receiving, from a user-side diagnosis device, a deterioration degree computed by the user-side diagnosis device for each of the components based on a plurality of sensor values obtained by the user-side diagnosis device from a corresponding plurality of state sensors of the plasma processing apparatus; and an analysis unit that calculates a robustness degree with respect to each of the components under a plurality of computation conditions for which the deterioration degree of the components has been calculated by the user-side diagnosis device, selects one computation condition from the plurality of computation conditions with respect to each of the components on the basis of the calculated robustness degree, and diagnoses the deterioration states of each of the components by using the selected computation condition in a state of not having received the plurality of sensor values by the maker-side diagnosis device, wherein the robustness degree is an index indicating the shareability of the tendency of the degradation degree for a plurality of maintenance cases of the plasma processing apparatus.

2. The diagnosis device according to claim 1, wherein an average value of correlation coefficients between the numbers of plasma processed specimens and the deterioration degrees is calculated as the robustness degree.

3. The diagnosis device according to claim 1, further comprising a display unit that displays alarm information related to a maintenance period of the plasma processing apparatus together with time series data related to the deterioration degree of the component.

4. A plasma processing apparatus comprising:

a processing chamber in which a specimen is plasma processed;

a radio frequency power supply that supplies radio frequency power for generating plasma; and a specimen stage on which the specimen is placed, wherein the plasma processing apparatus further comprises a maker-side diagnosis device that calculates a robustness degree with respect to each of a plurality of components of the plasma processing apparatus under a plurality of computation conditions based on a deterioration degree calculated for each of the components by a user-side diagnosis device, wherein the maker-side diagnosis device further selects one computation condition from the plurality of computation conditions with respect to each of the components on the basis of the calculated robustness degree, and diagnoses the deterioration state of each of the components by using the selected computation condition using the deterioration degree computed by a user-side diagnosis device for each of the components based on a plurality of sensor values obtained by the user-side diagnosis device from a corresponding plurality of state sensors of the plasma processing apparatus, wherein the maker-side diagnosis device further diagnoses the deterioration state of each of the components by using the selected computation condition using the deterioration degree computed by a user-side diagnosis device for each of the components in a state of not having received the plurality of sensor values by the maker-side diagnosis device, and wherein the robustness degree is an index indicating the shareability of the tendency of the degradation degree for a plurality of maintenance cases.

5. The plasma processing apparatus according to claim 4, wherein an average value of correlation coefficients between the numbers of plasma processed specimens and the deterioration degrees is calculated as the robustness degree.

6. The plasma processing apparatus according to claim 4, further comprising a display unit that displays alarm information related to a maintenance period together with time series data related to the deterioration degree of the component.

7. A plasma processing apparatus comprising:

a processing chamber in which a specimen is plasma processed;

a radio frequency power supply that supplies radio frequency power for generating plasma; and a specimen stage on which the specimen is placed, wherein the plasma processing apparatus is connected to a maker-side diagnosis device that calculates a robustness degree with respect to each of a plurality of components of the plasma processing apparatus under a plurality of computation conditions based on a deterioration degree calculated for each of the components by a user-side diagnosis device, wherein the maker-side diagnosis device further selects one computation condition from the plurality of computation conditions with respect to each of the components on the basis of the calculated robustness degree, and diagnoses the deterioration state of each of the components by using the selected computation condition using the deterioration degree computed by a user-side diagnosis device for each of the components based on a plurality of sensor values obtained by the user-side diagnosis device from a corresponding plurality of state sensors of the plasma processing apparatus, wherein the maker-side diagnosis device further diagnoses the deterioration state of each of the components by using the selected computation condition using the deterioration degree computed by a user-side diagnosis device for each of the components in a state of not having received the plurality of sensor values by the maker-side diagnosis device, and wherein the robustness degree is an index indicating the shareability of the tendency of the degradation degree for a plurality of maintenance cases.

8. A diagnosis method for diagnosing deterioration states of components of a plasma processing apparatus, the diagnosis method comprising the steps of:

obtaining, by a user-side diagnosis device, a plurality of sensor values from a corresponding plurality of state sensors of the plasma processing apparatus;

computing, by the user-side diagnosis device, a deterioration degree for each of the components based on the plurality of sensor values;

transmitting the deterioration degree for each of the components from the user-side diagnosis device to a maker-side diagnosis device via a network;

calculating, by the maker-side diagnosis device, a robustness degree with respect to each of the components under a plurality of computation conditions for computing the deterioration degrees of the components;

selecting, by the maker-side diagnosis device, one computation condition from the plurality of computation conditions with respect to each of the components on the basis of the calculated robustness degree; and diagnosing, by the maker-side diagnosis device, the deterioration state of each of the components by using the selected computation condition in a state of not having received the plurality of sensor values by the maker-side diagnosis device, wherein the robustness is an index indicating the shareability of the tendency of the degradation degree for a plurality of maintenance cases of the plasma processing apparatus.

9. The diagnosis method according to claim 8, wherein an average value of correlation coefficients between the numbers of plasma processed specimens and the deterioration degrees is calculated as the robustness degree.

10. The diagnosis method according to claim 8, further comprising a step of displaying alarm information related to a maintenance period together with time series data related to the deterioration degree of the component.

11. A semiconductor device manufacturing system comprising:

a semiconductor manufacturing apparatus;

a user-side diagnosis device connected to the semiconductor manufacturing apparatus via a first network; and a platform executing a diagnosis process for diagnosing deterioration states of components of the semiconductor manufacturing apparatus, wherein the platform is configured to perform diagnosis process steps of:

calculating a robustness degree with respect to each of the components under a plurality of computation conditions for computing deterioration degrees of the components;

selecting one computation condition from the plurality of computation conditions with respect to each of the components on the basis of the calculated robustness degree; and diagnosing the deterioration state of each of the components by using the selected computation condition in a state of not having received a plurality of sensor values from a corresponding plurality of state sensors of the plasma processing apparatus, wherein the robustness is an index indicating the shareability of the tendency of the degradation degree for a plurality of maintenance cases of the plasma processing apparatus.

12. The semiconductor device manufacturing system according to claim 11, wherein the diagnosis process is executed as an application provided on the platform.

* * * * *